United States Patent [19]

Kurogi et al.

[11] 4,233,526
[45] Nov. 11, 1980

[54] SEMICONDUCTOR MEMORY DEVICE HAVING MULTI-GATE TRANSISTORS

[75] Inventors: Yukinori Kurogi; Kiyoshi Sugibuchi, both of Tokyo, Japan

[73] Assignee: Nippon Electric Co., Ltd., Tokyo, Japan

[21] Appl. No.: 894,960

[22] Filed: Apr. 10, 1978

[30] Foreign Application Priority Data

| Apr. 8, 1977 [JP] | Japan | 52-40522 |
| May 30, 1977 [JP] | Japan | 52-63506 |
| May 30, 1977 [JP] | Japan | 52-63507 |

[51] Int. Cl.$^3$ ............... H03K 5/00; H01L 29/78; H01L 27/02; G11C 11/34
[52] U.S. Cl. ............... 307/238; 357/23; 357/41; 357/48; 357/54; 365/184
[58] Field of Search ............... 357/23, 41, 54; 307/238; 365/184

[56] References Cited

U.S. PATENT DOCUMENTS

| 3,660,697 | 5/1972 | Berglund et al. | 357/23 |
| 3,792,465 | 2/1974 | Collins et al. | 357/24 |
| 3,925,804 | 12/1975 | Cricchi et al. | 357/23 |
| 3,967,988 | 7/1976 | Davidsohn | 357/41 |
| 4,094,008 | 6/1978 | Lockwood et al. | 365/184 |
| 4,107,548 | 8/1978 | Sakaba et al. | 357/23 |

OTHER PUBLICATIONS

Frohman-Bentchkowsky "The Metal-Nitride-Oxide-Silicon (MNOS) Transistor-Characteristics and Applications", Proc. IEEE, vol. 58 (8/70), pp. 1207-1219.
Brewer "MNOS Density Parameters", IEEE Trans. Electron Devices, vol. ED-24 (5/77) pp. 618-625.
Vanstone "Metal-Nitride-Oxide-Silicon Capacitor Arrays...", Electronic Letters, vol. 8 (Jan. 13, 1972) pp. 13-14.
Kawagoe et al., "Minimum Size ROM Structure Compatible with Silicon-Gate E/D MOS LSI", IEEE JSSC, vol. SC-11 (6/76) pp. 360-364.
Yamaguchi et al., "Circuit Array and System of MAOS Type Fully Decoded Electrically Alterable Read Only Memory-IC", Japanese Journal Applied Physics, vol. 13 (9/74) pp. 1414-1420.

*Primary Examiner*—Gene M. Munson
*Attorney, Agent, or Firm*—Sughrue, Rothwell, Mion, Zinn and Macpeak

[57] ABSTRACT

A semiconductor memory device which may be formed in a parallel array for high density integration is disclosed. The memory device includes a multigate memory transistor formed in a first semiconductor region of one conductivity type in a substrate of the opposite conductivity type. The memory transistor is formed with source and drain regions of opposite conductivity type and a gate insulating layer formed on the surface between the source and drain regions. A plurality of gate electrodes are formed on the gate insulating layer and laterally separated from each other. A plurality of opposite conductivity type regions are formed in the first semiconductor region under the respective intervals between adjacent gate electrodes.

12 Claims, 16 Drawing Figures

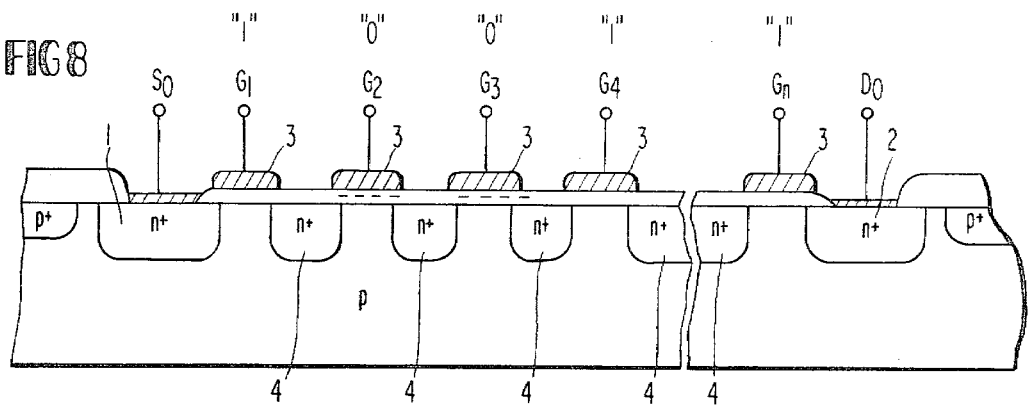
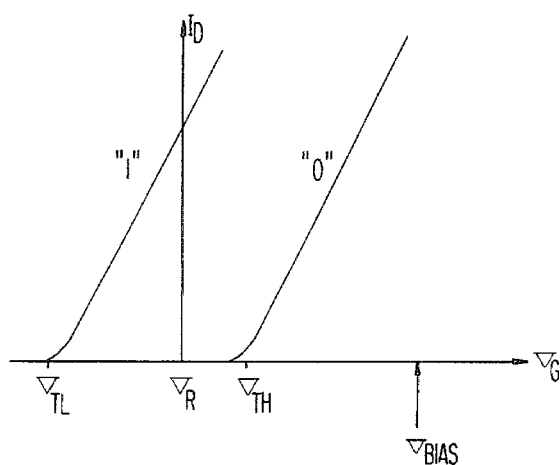
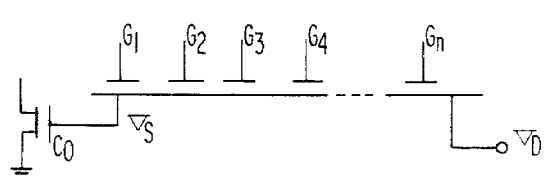
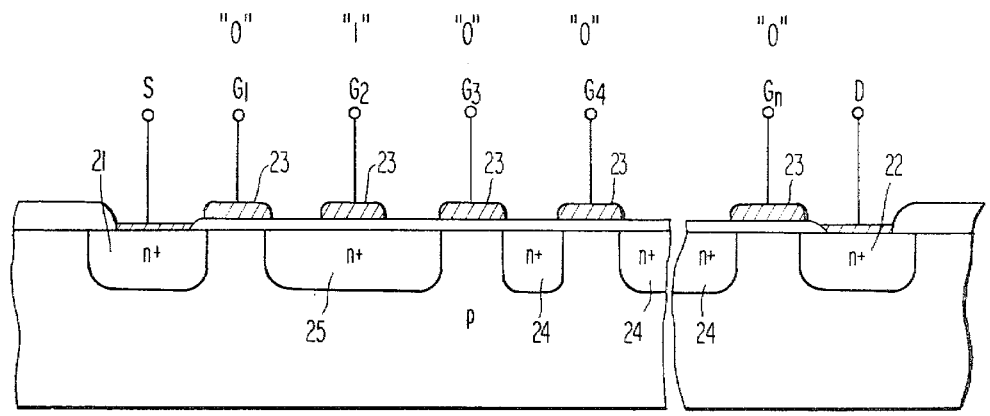

SEMICONDUCTOR MEMORY DEVICE HAVING MULTI-GATE TRANSISTORS

BACKGROUND OF THE INVENTION

1. Field of the Invention

The present invention relates to a semiconductor memory device, and more particularly, to a semiconductor memory device having a high density and a large capacity.

2. Description of the Prior Art

Semiconductor memory devices which are currently employed include static memory devices basically consisting of flip-flops with about 6 transistors per one bit and dynamic memory devices using 1 to 3 insulated gate field effect transistors (IGFET) per one bit and requiring refreshment of the stored information. Another type of semiconductor memory device makes use of a variation of a threshold value caused by trapping an electric charge at a trap level in a gate insulator film on a channel of an IGFET, typically known as MAOS (Metal-Alumina-Silicon Oxide-Silicon) or MNOS (Metal-Silicon Nitride-Silicon Oxide-Silicon) having a 2-layer insulator film. In these memory devices, by applying a voltage between a gate electrode and a substrate or between a gate electrode and a channel, the conductivity between the source and the drain is varied or completely eliminated, or owing to a memory effect of the gate insulator film, it is possible to maintain the conductivity over a long period of time. Also in some memory devices, the floating gate is provided in a gate insulator film, and by injecting a charge into the floating gate by any appropriate means to induce a charge of opposite polarity to the injected charge on a surface of silicon, a conductivity between a source and the drain is varied. Upon injecting the charge into the floating gate, it can be injected from the side of a silicon substrate or from the side of an electrode by making use of a tunnel phenomenon or a Schottky effect, or else, an avalanche phenomenon is generated by providing an appropriate p-n junction on the substrate side to produce the so-called hot electrons and hot holes having a large energy, and thereby the charge can be injected as overcoming an energy barrier existing between the silicon substrate and a silicon oxide film.

If such type of nonvolatile memory transistors are arranged in a matrix form on a single semiconductor substrate, bit selection would become impossible upon reading, because a plurality of memory transistors on a bit line may become normally-on. Therefore, a normally-off transistor having a fixed gate threshold voltage must be connected in series to each memory transistor. However, such construction is disadvantageous for high density integration, because the number of memory transistors that can be assembled on one chip must be reduced one-half. Another factor for preventing high density integration is the requirement for electrical isolation between wirings or between elements, which presents a problem especially in the case of n-channel type elements which can operate at a high speed. Namely, each bit element must be substantially surrounded by the isolation region including a high-concentration impurity region having the same conductivity type as the substrate. For example, the high-impurity region having 2 $\mu$m width is formed between a source region (bit line) of one element and a drain region (bit line) of an adjacent element, and the high-impurity region must be separated from the source or drain regions about 1 $\mu$m, or more. Therefore, the elements must be separated from each other by 4 $\mu$m or more. The above-described memory device employing MNOS's is disclosed, for example, in an article by Joe E. Brewer entitled "MNOS Density Parameters", *IEEE Transactions on Electron Devices*, Vol.Ed. 24, No. 5, May 1977, pp. 618 to 625 and in an article by Dov Frohman-Bentchkowsky entitled "The Metal-Nitride-Oxide-Silicon (MNOS) Transistor-Characteristics and Applications", *Proceedings of the IEEE*, Vol. 58, No. 8, August 1970, pp. 1207–1219.

In addition, the so-called mask-writing read-only memory device that is constructed by making use of insulated gate field effect transistors, has been heretofore widely used because it is simple in structure in that it is only necessary to array transistors in a two-dimensional manner to form a matrix. However, the read-only memory device in the prior art also had the same disadvantage as the aforementioned MNOS.

More recently, a new memory device has been proposed by G. F. Vanstone in a letter entitled "Metal-Nitride-Oxide-Silicon-Capacitor Arrays as Electrical and Optical Stores", *Electronics Letters*, Jan. 13, 1972, Vol. 8, No. 1, pp. 13–14. This memory device has a plurality of gates provided between the source and the drain. However, since this device is a MNOS type memory adapted to perform a CCD (Charged Coupled Device) operation, the resistance between the source and drain becomes inevitably high. Moreover, a high voltage must be applied to the gate electrodes for the CCD operation, and the stored information is badly affected by the high voltage.

SUMMARY OF THE INVENTION

One object of the present invention is to provide a semiconductor memory device having a simple structure, which can enhance the density of a monolithic integrated circuit memory array.

Another object of the present invention is to provide a memory device having a simple structure which can store a given information semi-permanently or for a desired fixed period without being connected to a power source.

Still another object of the present invention is to provide an integrated circuit memory array having effective memory transistors.

Further object of the present invention is to provide a particular method for driving the integrated circuit memory array.

Yet another object of the present invention is to provide an insulated multi-gate field effect transistor for use in a read-write memory or a read-only memory, in which the area required for isolation between elements and for the source and the drain is reduced so as to be adapted for extremely high-density integration.

According to one feature of the present invention, there is provided a semiconductor memory device comprising a semiconductor region of one conductivity type, and a multi-gate transistor formed in the semiconductor region. The multi-gate transistor includes a pair of source and drain regions of an opposite conductivity type formed in a major surface of the semiconductor region, a gate insulating layer formed on the major surface between the source and drain regions, a plurality of gate electrodes formed on the gate insulating layer and laterally separated from each other, and a plurality of opposite conductivity regions provided in the semiconductor region and under the respective intervals between adjacent gate electrodes.

According to another feature of the present invention, in the above mentioned memory device, the gate insulating layer comprises a silicon oxide film formed on the major surface of the semiconductor region, and a silicon nitride film or an alumina film formed on the silicon oxide film, so as to form charge storage means. In this case, the insulator film under the gates is similar to that used in the aforementioned MNOS and thus can be formed easily, and the gate threshold voltage can be varied by applying a voltage between the gate electrode and the semiconductor region or between the gate electrode and the channel section, so that the threshold voltage can be maintained within a given tolerance over a long period of time. In this memory device, the semiconductor region may be formed on or in a semiconductor substrate or on a sapphire or spinel substrate.

According to another feature of the present invention, there is provided a semiconductor memory device comprising a semiconductor region surrounded with an isolation region, a plurality of multi-gate transistors formed in the semiconductor region and arranged in parallel with each other, and a plurality of gate wiring layers. Each gate wiring layer is connected in common to the gates located at equivalent positions on the respective multi-gate transistor.

In the semiconductor memory device, a gate threshold voltage of the gate can be varied by applying a voltage between the gate electrode through wiring and the substrate or between the gate electrode and the channel, and furthermore the threshold voltage can be maintained within a given tolerance over a long period of time.

According to yet another feature of the present invention, the source of each multi-gate memory transistor is connected to the drain of a switching insulated-gate field effect transistor having a decoder function, and the sources of these switching transistors are connected in common to an output to which the gate of a read-out insulated-gate field transistor may be connected. A charging/discharging insulated-gate field effect transistor may be connected to the gate of the read-out insulated gate field effect transistor. The drains of the multi-gate memory transistors are connected in common via respective current-limiting insulated-gate field effect transistors.

According to yet another feature of the present invention, in the above mentioned semiconductor memory device, the source of each of the multi-gate memory transistors is connected to the drain of one switching insulated gate field effect transistor, and the sources of these switching transistors are connected in common to an output to which a gate of a read-out insulated gate field effect transistor may be connected. A charging/discharging insulated gate field effect transistor may be connected to the gate of the read-out insulated gate field effect transistor. The drains of each said multi-gate memory transistor are connected to the gates of the switching transistor connected to the source of the same memory multi-gate transistor.

A plurality of the multi-gate transistors are formed in a first semiconductor region, and isolation regions comprising thick field oxide layers or high impurity regions of the same conductivity type as the semiconductor region are preferably provided between each multi-gate transistors. Furthermore, the switching transistors, the current-limiting transistors, the read-out transistor or the charging/discharging transistor are preferably formed in another semiconductor region provided outside an isolation region surrounding the first semiconductor region but formed on or in the same substrate as the first semiconductor regions.

BRIEF DESCRIPTION OF THE DRAWINGS

The above-mentioned and other features and objects of this invention will become more apparent by reference to the following description taken in conjunction with the accompanying drawings, in which:

FIG. 8 is a cross-section view of a memory transistor to be used in the third preferred embodiment;

FIG. 9 represents characteristics of gate voltage versus drain current to show the fact that the information stored in the memory transistor shown in FIG. 8 is determined by the threshold values at the respective gate sections;

FIG. 10 is a schematic view showing the principle of operation of the third preferred embodiment in FIG. 7;

FIG. 11 is a cross-section view of another memory transistor to be used in the third preferred embodiment;

DESCRIPTION OF THE PREFERRED EMBODIMENTS

Embodiment 1

Figure 1:
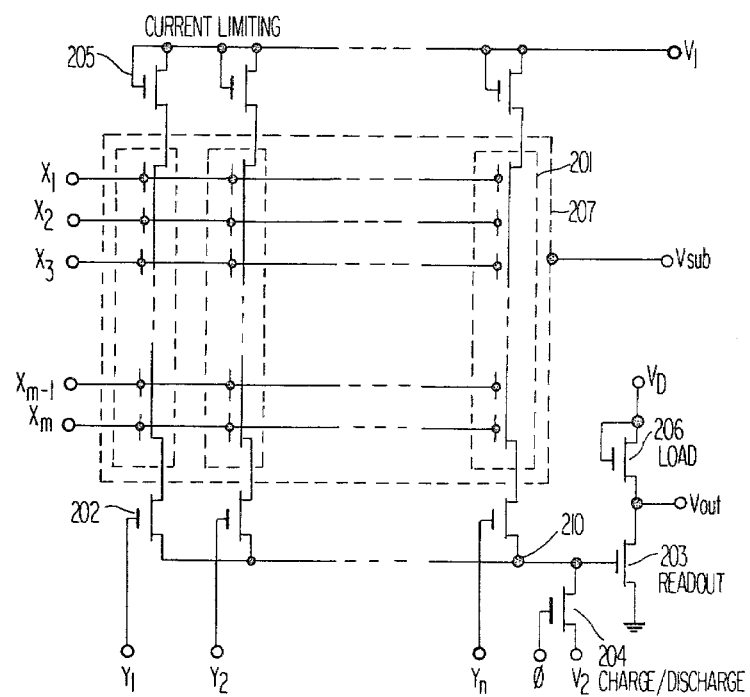
FIG. 1 is a circuit diagram showing a first preferred embodiment of the present invention.
Figure 2:
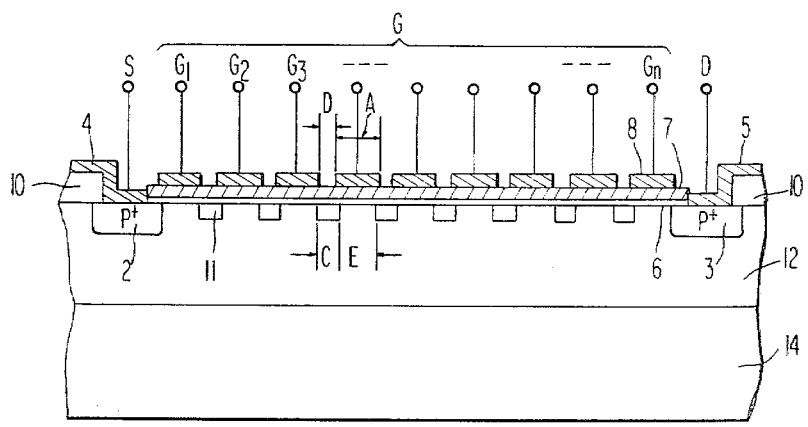
FIG. 2 is a cross-sectional view of a memory transistor to be used in the first preferred embodiment.
Figure 3A:
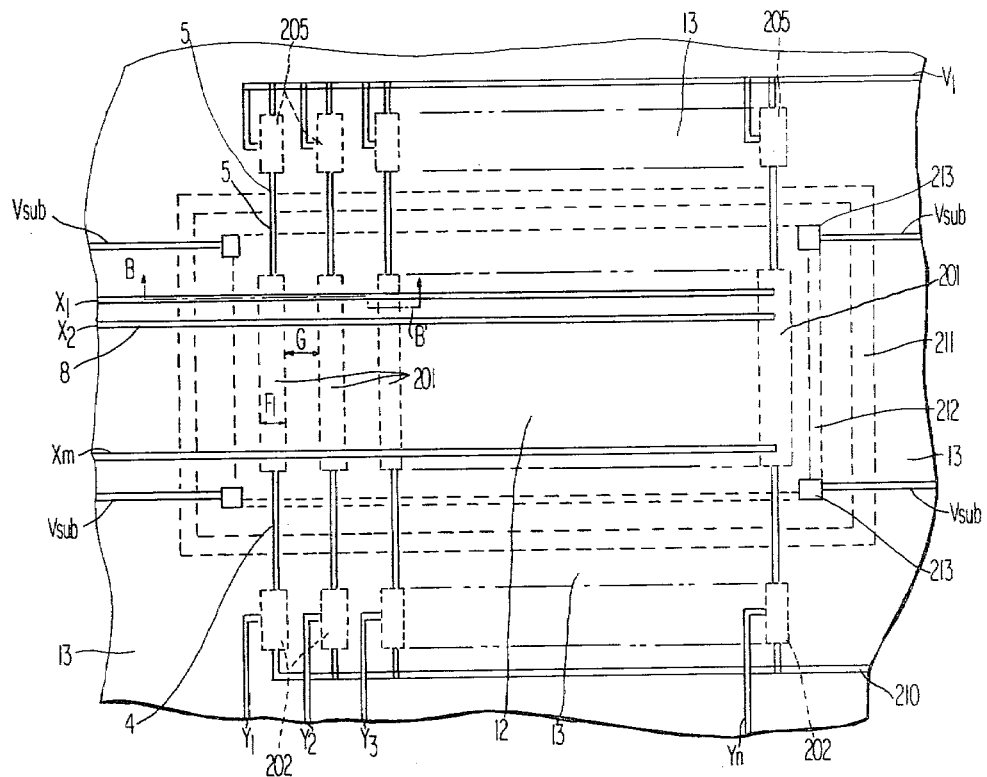
FIG. 3A is a plan view of the first embodiment.

Referring now to the accompanying drawings, a first preferred embodiment of the present invention is illustrated in FIG. 1, and a typical example of an insulated gate field effect nonvolatile memory transistor having desirable characteristics for use in the memory device in FIG. 1 is shown in cross-section in FIG. 2. With reference to FIG. 2, at first a source region 2 and a drain region 3 both of p-type are formed in an n-type silicon region 12, while the region 12 is formed on a p-type substrate 14 by epitaxial growth. A source electrode 4 and a drain electrode 5 are connected to the respective regions 2 and 3. Typically, a silicon oxide film 6 and a relatively thick silicon nitride film 7 are disposed on the surface of the N-type silicon region 12 between the source region 2 and the drain region 3, and sometimes fine particles of tungsten or the like are inserted between the silicon oxide film 6 and the silicon nitride film 7. The neighborhood of the boundary surface between the silicon oxide film and the silicon nitride film 7 forms a charge storage layer. On the silicon nitride film 7 are provided n gate electrodes 8 ($G_1, G_2, \ldots, G_n$) which are electrically isolated from each other but placed as close as possible to each other. A substrate electrode 213 (shown in FIG. 3A) is provided on the silicon region 12, and the surface of the n-type silicon region other than the region between the source region 2 and the drain region 3 is protected by an insulator film 10. In addition, p-type regions 11 in the n-type silicon region surface are located directly under the intervals between the adjacent gate electrodes 8. In this embodiment, the length A of the gate electrode is 8 $\mu$m, and the interval length D between the adjacent gate electrodes is 4 $\mu$m. The length C of the p-type region 11 is 6 $\mu$m, and the channel length E is 6 $\mu$m. Interruption of channel formation right under the intervals between the adjacent gate electrodes 8 is prevented by providing such p-type regions 11.

For instance, with regard to a representative structure of the MNOS, in one preferred embodiment in which aluminum or low-resistance polysilicon containing an impurity is used as the gate electrode, or the gate wiring layer 8, the thickness of the silicon nitride film is selected at 450 Å, while the thickness of the silicon oxide film is selected at 90 Å, and $1.5 \times 10^{15}$ atoms of tungsten are inserted in the boundary surface between the silicon nitride film and the silicon oxide film. Since such a MNOS structure has a relatively thick silicon oxide film, if a pulse of $+35$ V in magnitude relative to the n-type region and about 100 microseconds in duration is applied to the gate electrode, then only electrons are injected from the n-type silicon region into the silicon oxide film and are trapped in the neighborhood of the boundary surface between the silicon nitride film and the silicon oxide film, and thereby the gate threshold voltage of the MNOS structure can be made $+3$ V or higher. These trapped electrons are hard to move freely under such a weak electric field as being applied to the insulator film during read-out and memory preservation, and at a room temperature they can be kept trapped over a long period of several tens of years.

These trapped electrons induce holes having a charge of opposite polarity to the electrons in the surface portion of the silicon region, so that in the case of an n-type silicon region, a p-type channel is formed. If a pulse of $-35$ V in magnitude relative to the n-type silicon region and about 100 microseconds in duration is applied to the gate electrode, then at this moment electrons are easily released from the neighborhood of the boundary surface between the silicon nitride film and the silicon oxide film through the particles of tungsten or the like which are present at the boundary surface between the silicon nitride film and the silicon oxide film. In the case where the particles of tungsten or the like are not inserted, it is difficult to completely recover the gate threshold value before a write operation, and even if a high voltage should be applied forcibly, it would result in only breakdown of the insulator film and it is difficult to rewrite the memory device by releasing electrons. In the case where the silicon oxide film is as thick as about 90 Å, during the release of electrons, holes would not be injected at the same time from the side of the silicon, and in the structure having tungsten or the like inserted, the gate threshold voltage would saturate at about $-2$ V. This saturating characteristic is very favorable for the present invention. That is, in an insulated gate field effect memory transistor having a plurality of gates, namely a multi-gate transistor, in order to know the conducting state (whether conducting or non-conducting) under a gate which is desired to be read, it is necessary to bring the channel sections under all the other gates into a conducting state, and on the other hand it is required that the voltage applied to all the other gates which is necessary for that purpose must be a voltage smaller in magnitude than the voltage of $\pm 35$ V to be used for write and erase operations and also must be such a small voltage as not affecting the memory preservation characteristics, for instance, in the case of a p-channel it must be about $-5$ v, so that if the gate threshold voltage saturates at $-2$ V as described above, then a conducting state can be assured with a gate bias of about $-5$ V at most without leaving any problem with respect to the memory preservation characteristics.

Figure 3B:
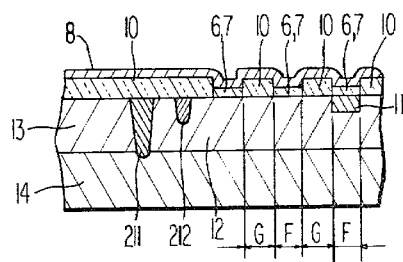
FIG. 3B is a cross-sectional view taken along the line B—B' and viewed in the direction of arrows of FIG. 1.

In the nonvolatile memory device illustrated in FIG. 1, n memory transistors of p-channel type each having m gates as illustrated in FIG. 2 are arrayed in parallel to each other. As described above, the sources of the n memory transistors 201 each having m gates are connected to an output 210 of the integrated circuit, respectively through switching transistor 202 of the normally-off type. And a gate of a read-out transistor 203 is connected to the output 210. In addition, a charging/discharging transistor 204 is connected to the gate of the read-out transistor 203 to perform dynamic read-out. In the case where the memory block which has been first employed according to the present invention need not be operated at a high speed, the memory circuit can be made to perform a static operation by replacing the charging/discharging transistor 204 with a load transistor. However, in FIG. 1 is illustrated the case of dynamic operations in which the memory device can operate at a high speed. A characteristic feature of this preferred embodiment exists in that there are provided the charging/discharging transistor 204 and the current-limiting transistors 205 which are respectively connected in series to the drains of the multi-gate memory transistors, and thereby wirings running respectively over the gate wirings of the respective multi-gate memory transistors can be eliminated. The preferred embodiment illustrated in FIG. 1 has merit in that even in case that two memory blocks each of which is shown in FIG. 1 are integrated as aligned in the longitudinal direction, the memory device can be manufactured with a single layer of metallic wirings. According to the preferred embodiment illustrated in FIG. 1, if it is assumed that the number of gates in one memory transistor 201 is 128, then with only the memory section framed by a dotted line 207, it is possible to easily store an information of about 32,000 bits in an area of 2.5 mm $\times$ 2.5 mm. A transistor 206 in FIG. 1 is a load transistor for a read-out operation, and the n-type silicon region isolation is effected between a memory section 207 framed by a dotted line and a peripheral circuit section including the load transistor 206, through a method of carrying out diffusion isolation by employing, for example, an SOS (Silicon on Sapphire) or an epitaxial silicon layer, so that an erase voltage of about $-35$ V may be applied to the memory section from the side of the substrate. Referring now FIGS. 3A, 3B, a plurality of the multi-gate transistors 201 are formed in the n-type silicon region 12, while the region 12 of thickness 8 μm and $10^{15}$ atoms/cm$^3$ is formed on the p-type substrate 14 by an epitaxial growth and surrounded by an isolation region including the p$^+$ region 211 of width 20 μm and the field oxide layer 10. On the other hand, the peripheral transistors 202, 205, 204, 203, 206, etc are formed in the n-type silicon region 13 which is also formed on the p-type substrate. The multi-gate transistors are also surrounded with a n$^+$ region 212 of width 4 μm which is provided to feed a voltage to the channel regions of the multigate transistors via electrodes 213, effectively. (Hereinafter this voltage is briefly called a substrate voltage or $V_{SUB}$). A plurality of wiring layers 8 of aluminium or polycrystalline silicon are provided as the gate electrodes of the multi-gate transistors and extending over the field oxide 10, and the drain electrodes 5 and the source electrodes 4 of the multi-gate transistor 201 are connected to the sources of the current-limiting transistors 205 and the drains of the switching transistors, respectively. And, in the embodiment, the channel width F is about 10 μm, and the interval G between each transistors is about 5 μm.

Figure 4:
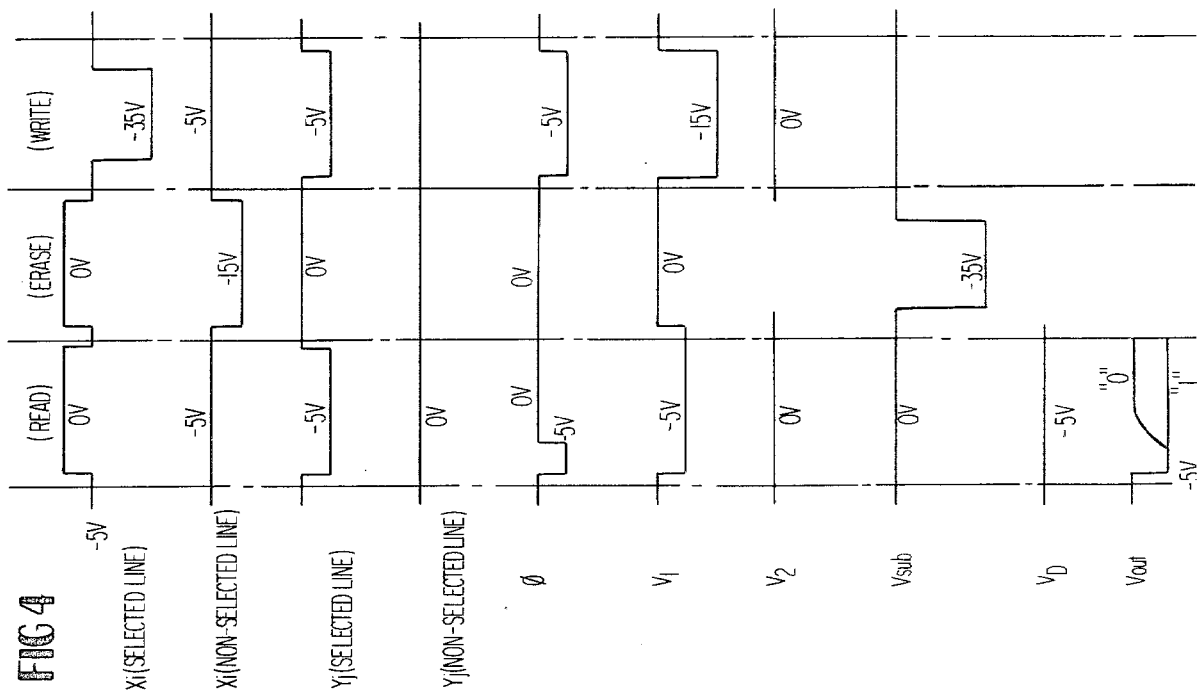
FIG. 4 shows voltages applied to various points in the first preferred embodiment upon read, erase and write operations.

In order to further clarify the characteristic feature of the present invention, by way of example, the preferred embodiment illustrated in FIG. 1 is chosen and the method for applying driving voltages in this preferred embodiment will be explained with reference to FIG. 4. At first, a read-out operation will be described in detail with reference to FIG. 4. In the illustrated embodiment, it is assumed that a write operation has been already effected at the respective gate sections of the memory transistors 201 each having a plurality of gates, and that the threshold voltages of the gate sections at all the addresses are set either at a voltage of +2 V or higher corresponding to write of "0" or at a voltage of 0 V to about −2 V corresponding to write of "1". In addition, it is assumed that the transistors in the peripheral circuit have a threshold voltage of −1 V. Firstly, a voltage of 0 V is applied to a selected $X_i$ terminal-terminal $X_k$ (k being an integer of 1 to m), while a voltage of −5 V is applied to unselected $X_i$-terminals. Furthermore, a voltage of −5 V is applied to a selected terminal $Y_j$-terminal $Y_l$ (l being an integer of 1 to n), while a voltage of 0 V is applied to unselected $Y_j$-terminals, and also a voltage of −5 V is applied to a $V_1$-terminal to make the current-limiting transistor 205 conducting. Then, if the threshold voltage of the gate section included in the l-th memory transistor having a plurality of gates and located under the k-th gate electrode, is +2 V or higher, that is, if an information "0" is stored in that gate section, the gate voltage of the read-out transistor 203 can take a voltage of −2 V to −3 V, and so the read-out transistor 203 is turned on. On the other hand, if the threshold voltage of the gate section included in the l-th memory transistor having a plurality of gates and located under the k-th gate electrode, is 0 V to about −2 V, the is, if an information "1" is stored in that gate section, the source-drain path of the l-th memory transistor having a plurality of gates is in an off state. Accordingly, as shown in FIG. 4, the charging/discharging transistor 204 becomes conducting temporarily at this instance and brings the gate voltage of the read-out transistor 203 to a zero voltage, so that the read-out transistor 203 is kept off over a long period of time. Furthermore, in the illustrated embodiment, since a leakage path adapted to bring the gate voltage of the memory transistor to −1 V or lower does not exist, it is practically possible to read out entirely in a static manner after discharge.

Now an erase operation of the illustrated embodiment will be described. Erase can be effected individually for each gate electrode block by applying a negative voltage pulse of −35 V in magnitude and about 100 microseconds to the side of the substrate or n-type region. During this operation, the wirings connected to the sources and drains of the respective memory transistors each having a plurality of gates, are made to have a high impedance. The so-called block erase for each gate can be carried out by applying a voltage of 0 V to a gate to be erased while applying a half-selection voltage of about −15 V to a gate which is not desired to be erased. The block erase for each gate can be also carried out by applying an erase voltage of +35 V to a gate to be erased. In the erase operation, electrons are injected to a trap level in the gate insulator, and a channel is formed under the erased gate.

Now a write operation of the illustrated embodiment will be described. Upon write, at first a half-selection voltage of −15 V is applied to the $V_1$-terminal. Next, in order to select a transistor on which write is to be effected, only the switching transistor 202 that is connected to the source of the transistor on which write is to be effected, is made conducting. Then the half-selection voltage is consumed by the current limiting transistor 205, and the channel in that memory transistor is kept at a nearly zero voltage. Under such condition, if a write voltage is applied only to the gate wire for which write is to be effected, an information is written only at the selected address. At this moment, a voltage $V_2$ is, of course, 0 V and the charging/discharging transistor 204 is conducting.

The memory block according to the present invention can be modified, for example, in such manner that the switching transistor 202 in FIG. 1 is replaced by a plurality of serially connected transistors to be used as a selector having a decode function for the memory transistors. In addition, if a depletion type is used in place of the current limiting transistor 205, then on the contrary to the above described embodiment, in which upon read-out operation, the $V_1$-terminal is kept at 0 V while the $V_2$-terminal is kept at −5 V. The gate of the read-out transistor 203 is initially charged at −5 V, then the selected bit information can be read out by the discharged mode from the gate of the read-out transistor 203. In this case, the read-out time is more severely limited but there is an advantage that the margin for the threshold voltage difference between write and erase of an MNOS memory becomes large and thereby the memory holding time can be extended longer. In addition, the margin for various design parameters of the peripheral circuit or the like is also increased.

In the illustrated embodiment, the erase operation was described as a block erase for each gate wiring. However, since the number of gates included in each block can be readily increased to about 100, and since the memory device can be divided into a great number of blocks upon practical integration, the memory device according to the present invention is practically useful as an excellent random-access nonvolatile semiconductor memory device.

While the above-description of the first preferred embodiment of the present invention was made in connection to p-channel type elements, it is a matter of course that the present invention is equally applicable to n-channel type elements.

Embodiment 2

Figure 5:
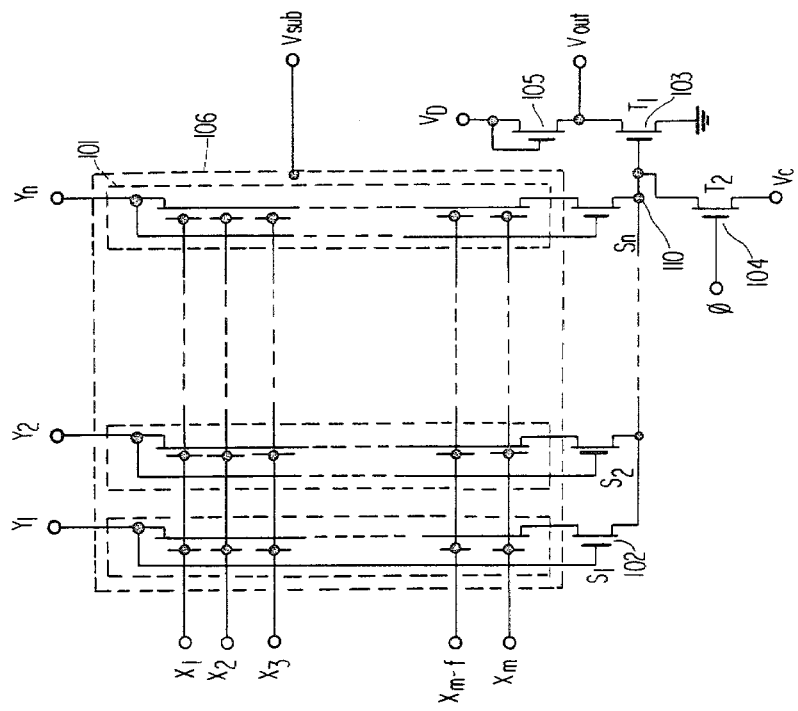
FIG. 5 is a circuit diagram showing a second preferred embodiment of the present invention.

A second preferred embodiment of the present invention is illustrated in FIG. 5. Memory transistors used in this embodiment are similar to that shown in FIG. 2. And transistors 101, 102, 103, 104 and 105 in FIG. 5 correspond to the transistors 201, 202, 203, 204 and 206, respectively. In FIG. 5, the transistor 105 is a load for the read-out transistor 103. However, it is to be noted that this load could be a depletion load differing from the illustrated load, or else by replacing another switching transistor for this load, it is possible to make the read-out sensing and buffer circuits themselves perform a dynamic operation.

A characteristic feature of this preferred embodiment exists in that the drains $Y_j$ of the respective memory transistors 101 each having a plurality of gates are connected to the gates of the corresponding switching transistors $S_p$ (p being an integer of 1 to n). Accordingly, in the case where a plurality of memory blocks each of which is shown in FIG. 5 are further integrated as aligned in the longitudinal direction, a wiring running in the longitudinal direction above the gate electrodes of each memory transistor and insulated therefrom can be made a single wiring. Consequently, the degree of integration can be improved in contrast to the case where the respective drain wiring of the memory transistors 101 each having a plurality of gates and the gate wirings of the respective switching transistors $S_p(102)$ are made to run in parallel to each other. Also, in this preferred embodiment, substrate isolation is effected between a memory transistor section 106 and a peripheral circuit section through a method of carrying out diffusion isolation by employing, for example, an SOS (Silicon on Saphire) or an epitaxial substrate, so that an erase voltage of about $-35$ V may be applied to the memory section from the side of the substrate.

Figure 6:
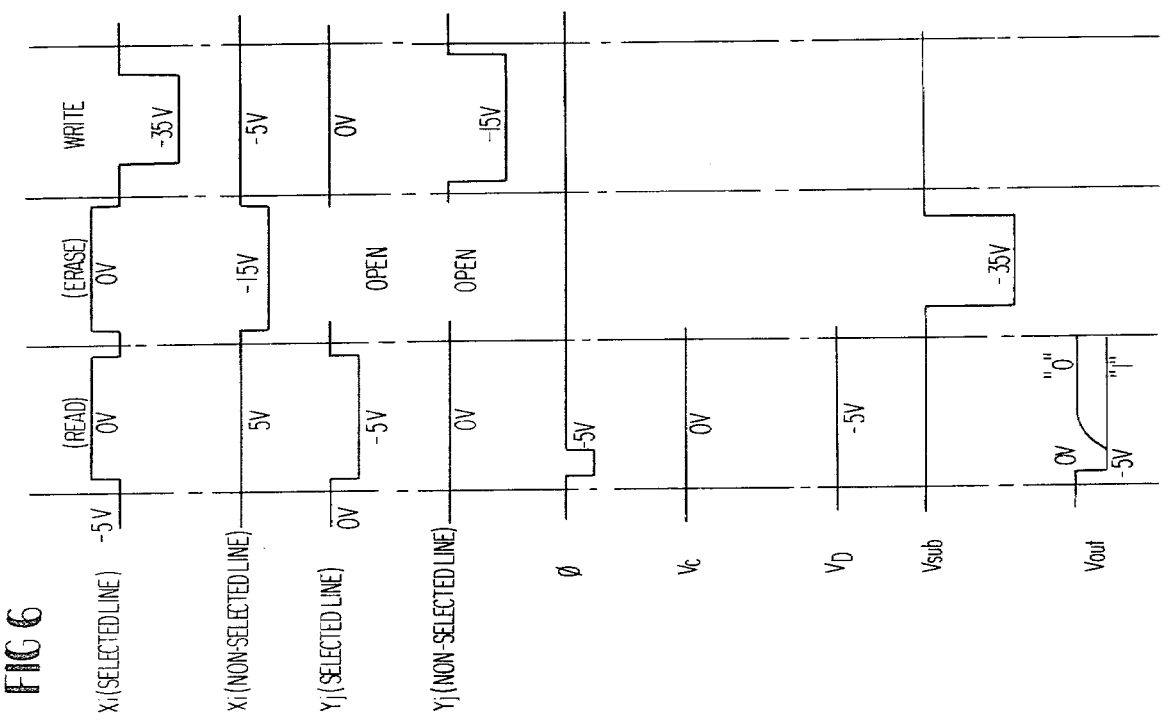
FIG. 6 shows voltages applied to various points in the second preferred embodiment upon read, erase and write operations.

Now description will be made on a read-out operation in this preferred embodiment with reference to FIG. 6. Firstly, it is assumed that a write operation has been already effected at the respective gate sections of the memory transistors 101 each having a plurality of gates, and that the threshold voltages of the gate sections at all the addresses are set either at a voltage of $+2$ V or higher corresponding to writing "0" or at a voltage of 0 V to about $-2$ V corresponding to writing "1". In addition, it is assumed that the transistors in the peripheral circuit have a threshold voltage of $-1$ V. Then, at first, a voltage of 0 V is applied to a selected $X_i$ terminal-terminal $X_k$ (k being an integer of 1 to m), while a voltage of $-5$ V is applied to unselected $X_i$-terminals. Furthermore, a voltage of $-5$ V is applied to a selected terminal $Y_j$-terminal $Y_l$ (l being an integer of 1 to n), while a voltage of $-5$ V is applied to unselected $\overline{Y}_j$-terminals. If the threshold voltage of the gate section included in the l-th memory transistor having a plurality of gates and located under the k-th gate electrode, is $+2$ V or higher, that is, if an information "0" is stored in that gate section, then the gate voltage of the read-out transistor 103 can take a voltage of $-2$ V to $-3$ V, and so, the read-out transistor 103 is turned on. On the other hand, if the threshold voltage of the gate section included in the l-th memory transistor having a plurality of gates and located under the k-th gate electrode, is 0 V to about $-2$ V, that is, if an information "1" is stored in that gate section, then the source-drain path of the l-th memory transistor having a plurality of gates is in an off state. Accordingly, as shown in FIG. 6, the charging-/discharging transistor 104 becomes conducting temporarily at this instance and brings the gate voltage of the read-out transistor 103 to a zero voltage, so that the readout transistor 103 is kept off over a long period of time. Furthermore, in the illustrated embodiment, since a leakage path adapted to bring the gate voltage of the memory transistor to $-1$ V or lower does not exist, it is practically possible to read out entirely in a static manner after discharge.

Now an erase operation of the second preferred embodiment will be described with reference to FIG. 6. Erase can be effected individually for each gate electrode by applying a negative voltage pulse of $-35$ V in magnitude and about 100 microseconds in duration from the side of the substrate of the n-type region. During this operation, the wirings connected to the sources and drains of the respective memory transistors each having a plurality of gates are made to have a high impedance. The so-called block erase for each gate can be carried out by applying a voltage of 0 V to a gate to be erased while applying a half-selection voltage of about $-15$ V to a gate which is not desired to be erased. In the erase operation, electrons are injected to a trap level in the gate insulator, and a channel is formed under the erased gate.

Now a write operation of the second preferred embodiment will be described also with reference to FIG. 6. Wirte is effected by applying a write voltage pulse of $-35$ V in magnitude and about 100 microseconds in duration to a gate on which write is to be effected. During this operation, if a half-selection voltage of about $-15$ V is preliminarily applied to the respective drains of the memory transistors each having a plurality of gates on which write is not to be effected, write is never effected on these gates. With regard to the method for inputting the data of whether write is to be effected or not, two methods including a method of inputting from the gate electrode side of the memory transistor and a method of inputting from the drain or source side of the transistor, can be thought of. In the second preferred embodiment, either method can be employed.

Embodiment 3

At first, an insulated multi-gate field effect transistor for read-only memory use that is employed as a memory transistor M in a read-only memory device shown in FIG. 7 will be described with reference to FIGS. 8, 9, 10 and 11.

FIG. 8 is a schematic cross-section view of the above-mentioned insulated multi-gate field effect transistor for read-only memory use. While an example of an n-channel transistor employing a p-type substrate is illustrated in FIG. 8, a similar transistor can be manufactured as a p-channel element employing an n-type substrate. However, for simplicity of explanation, the transistor is depicted and described only in connection to the n-channel element. In this element, between a source $S_o$ designated by reference numeral 1 and a drain $D_o$ designated by numeral 2 are formed n gates $G_1, G_2, ---, G_n$ designated by numeral 3, and in the semiconductor surface portion between these gates are formed high-concentration impurity regions 4 of the same conductivity type as the source 1 and the drain 2. The respective gate sections are manufactured so as to take either one of two threshold voltages as illustrated in FIG. 9 depending upon the informations to be written, and in the example shown in FIG. 8 the gates $G_1, G_2, G_3, G_4, ---, G_n$ are manufactured so as to store the informations of "1", "0", "0", "1", ---, "1", respectively. With regard to the method for preliminarily controlling the threshold voltages of the gates upon manufacture, various methods have been known such as, for example, a method of varying the thickness of an oxide film, or a method of forming an impurity layer in the semiconductor surface portion under the gate as by ion injection. Upon read-out of the thus written information "0" or "1", a voltage having a voltage value $V_R$ between the gate threshold voltages $V_{TH}$ and $V_{TL}$ corresponding to the informations "0" and "1", respectively, as shown in FIG. 9 is applied to a selected gate, while a voltage indicated by $V_{bias}$ in FIG. 9 is applied to all the unselected gates so that a channel may be formed under the unselected gates. Then depending upon whether the threshold value of the selected gate is $V_{TH}$ or $V_{TL}$, a channel is formed or not formed, respectively, under the selected gate. Accordingly, if the threshold value of the selected gate is $V_{TL}$, the source-drain path is conducting as communicated through a channel, whereas if it is $V_{TH}$, the source and the drain are insulated from each other. Here, if the voltages are selected so as to satisfy the relation $|V_{bias} - V_{TH}| > V_D$, then in FIG. 10 a capacitor Co can be charged up until the source voltage $V_S$ becomes $V_S = V_D$. If the capacitor Co is replaced by a gate of an insulated gate field effect transistor, then the device can be made to have a low impedance as viewed from an output side, and therefore, an advantage is obtained in that the device can be electrically matched easily. By employing the aforementioned construction according to the present invention, between the source and the drain are vitually provided n insulated gate field effect transistors connected in series. However, the number of metallic contact sections for wiring the source and drain sections can be reduced to 2 or less for n gates. Furthermore, since there is no need to make ohmic contact with metal at the impurity regions 4 provided between the gates, the impurity regions can be made small, and also since the isolation between the elements including n gates between the source and the drain should not exist rather than need not exist, the area required for isolation between the elements becomes very small. Another insulated gate field effect transistor having a plurality of gates that is available in the read-only memory device in FIG. 7 is illustrated in cross-section in FIG. 11. In the transistor shown in FIG. 8, the kinds of actively operable gate sections having different threshold voltages are produced for storing informations "0" and "1", respectively. However, in the modification shown in FIG. 11, a high-concentration impurity region 25 having the same conductivity type as impurity regions 24 between the gate sections is formed at a gate section. Only a gate $G_2$ which has the impurity layer 25 formed in the above-described manner stores an information "1". In FIG. 11, parts designated by numerals 21, 22, 23 and 24, respectively, correspond to the parts 1, 2, 3 and 4 in FIG. 8. The merit of this modified transistor exists in that the manufacturing process for producing different gate threshold voltages can be omitted, and that passivation of the gate sections can be effected in the same process as the formation of the impurity layers between the gates. In the third preferred embodiment of the present invention illustrated in FIG. 7, as switching transistors $S_p$ (p=1, 2, ..., n) connected to the sources of the insulated multi-gate field effect transistors for read-only memory use Mi (i=1, 2, ..., n) switching transistors operable in an enhanced mode are used, furthermore as a read-out transistor $T_1$ and as a charging/discharging transistor $T_2$ for effecting a reliable read-out operation also switching transistors operable in an enhanced mode are used, and further, as the read-out transistor $T_1$ a load transistor operable in a depletion mode is used.

Figure 12:
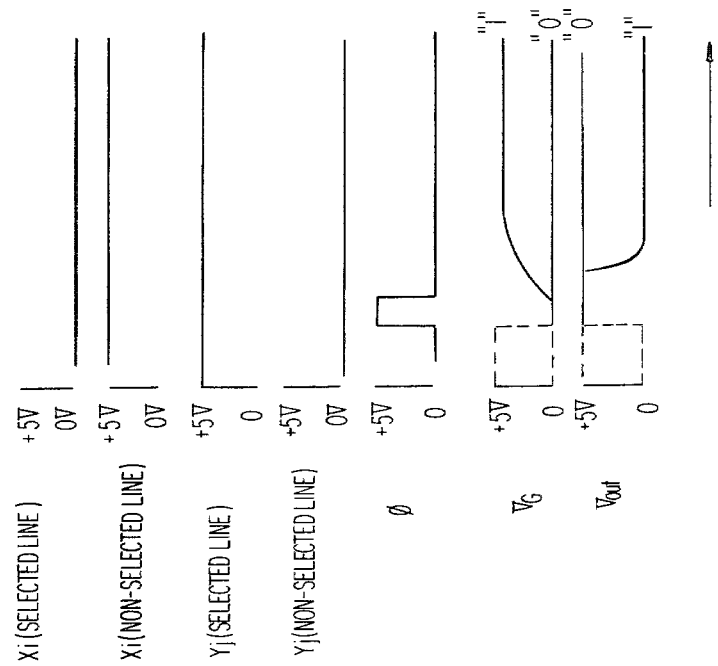
FIG. 12 shows voltages applied to various points in the third preferred embodiment upon a read-out operation.

In FIG. 12 are shown a method for applying voltages to various wires for read-out in the case of an n-channel, and variations of the gate voltage $V_G$ of the read-out transistor and the output voltage occuring at that time. A voltage $V_R$ for read-out as explained with reference to FIG. 9 is applied to a selected terminal $X_i$-terminal $X_k$ (k being an integer selected from 1, 2, ..., 8) that is connected to the gates of the memory transistors, while a voltage $V_{bias}$ is applied to unselected terminal $X_i$. In this case also, the two values $V_{TL}$ and $V_{TH}$ can be easily controlled upon manufacture similarly to the manufacturing process of the conventional MOS (metal-Silicon Oxide-Silicon) transistors. For instance, if the values of $V_{TL} = -3$ V and $V_{TH} = +1.0$ V are selected and the threshold voltages of the peripheral transistors $S_p$ (P=1, 2, ..., n), $T_1$ and $T_2$ are selected at +1.0 V, then the values of $V_R$ and $V_{bias}$ can be selected at $V_R = 0$ and $V_{bias} = +5$ V. On the other hand, if a selected terminal $Y_j$-terminal $Y_l$ (l being an integer selected from 1, 2, ..., n) on the Y side is held at +5 V, while unselected terminal $Y_j$ is held at 0 V, then a switching transistor $S_p$ becomes conducting while the other switching transistors become non-conducting, so that the source of only the p-th memory transistor can be connected to the gate of the read-out transistor, and depending upon the gate threshold voltage at the k-th gate section which was preset upon manufacture, the current supplied from the drain can be controlled so as to make the charging to the gate of the read-out transistor either possible or impossible. In the case of the aforementioned parameters, the value of the gate voltage $V_G$ of the read-out transistor takes a value of $V_G = 3$ V when the threshold voltage at the k-th gate of the p-th memory transistor is equal to $V_{TL} = -3$ V, or takes a value of $V_G = 0$ V when it is equal to $V_{TH} = 1.0$ V, and thus it can take the respective values which are above and under the threshold value of the read-out transistor $T_1$ of 1.0 V, so that it can be seen that an inverter circuit can be operated resulting in an output voltage of about 0 V or about +5 V depending upon whether the threshold voltage of the selected gate is $V_{TL}$ or $V_{TH}$.

Embodiment 4

Figure 7:
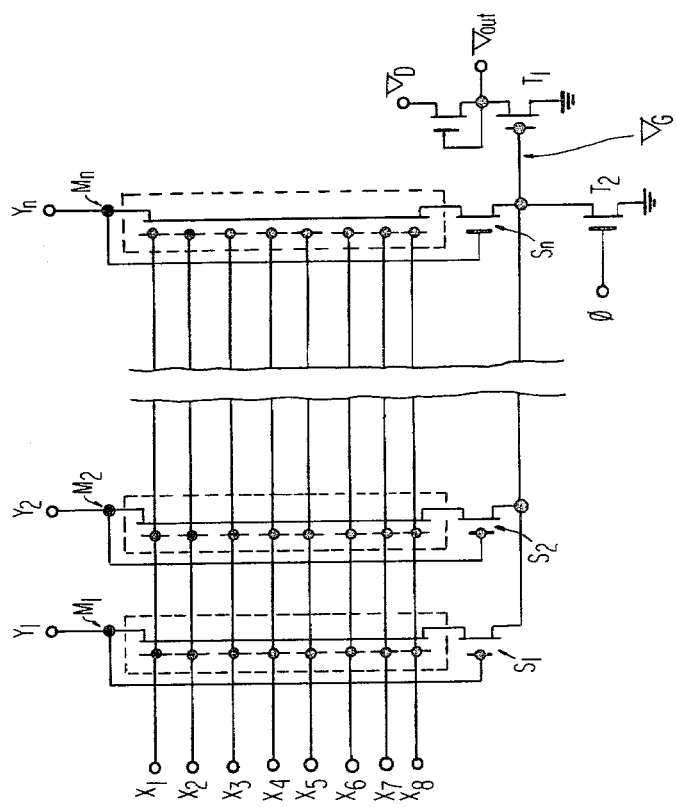
FIG. 7 is a circuit diagram showing a third preferred embodiment of the present invention.

In the preferred embodiment shown in FIG. 7, to increase the number of the gates of a transistor M excessively is not desirable because a read-out time is prolonged, and it is believed that a number of 8 or 16 or so is an appropriate value. Assuming that dimensions of one gate is 4 μm, and a distance between insulated gate field effect transistors each having a plurality of gates is 4 μm, then an area necessitated for storing an information of one bit is equal to $(4+4) \mu m \times (4+6) \mu m = 80$ μm².

Figure 13:
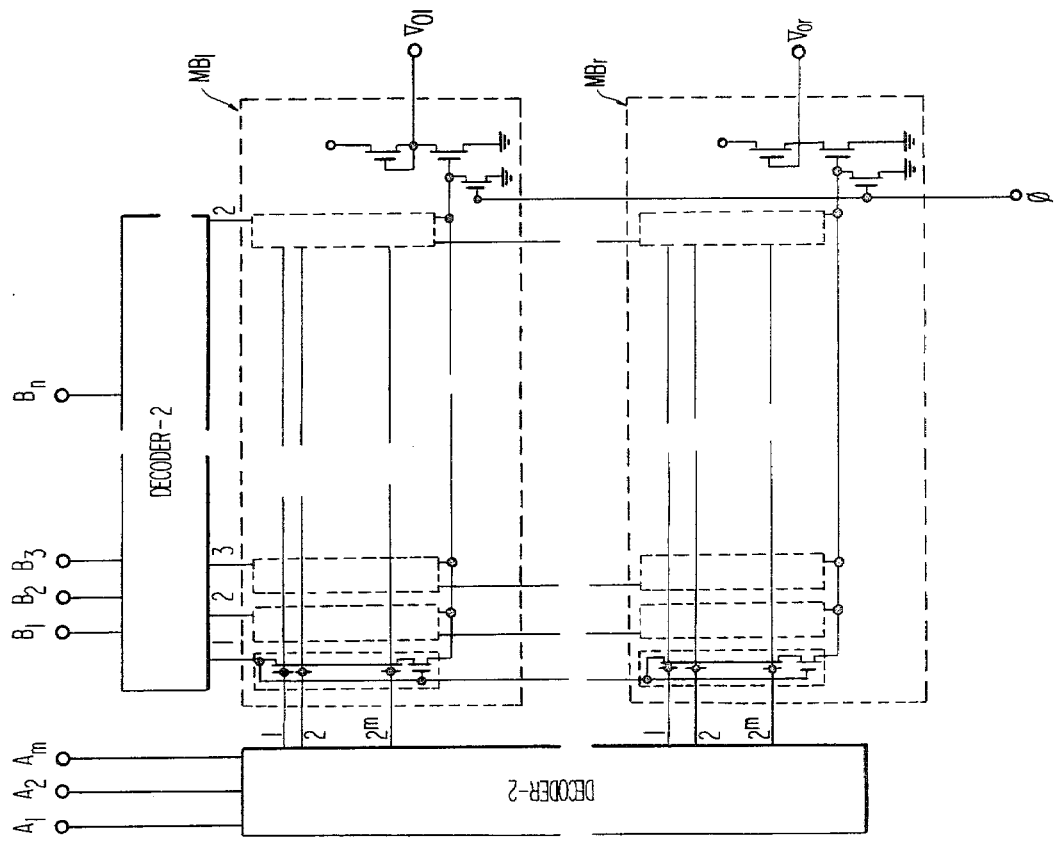
FIG. 13 is a circuit diagram showing a fourth preferred embodiment of the present invention.

In FIG. 7, in case where $n = 2^8$ is fulfilled, the memory device can store an information of $8 \times 2^8$ bits, that is, 2048 bits, but its configuration becomes an extremely elongated shape of 80 μm × 2.56 mm. Accordingly, in this fourth preferred embodiment, r memory blocks having the shape shown in FIG. 7 are arranged in multiple as shown in FIG. 13. If such an array is used, r informations are outputted in parallel. If the number is selected to be r=32, then assuming that each memory transistor has 8 gates and the number of the memory transistors n is equal to $2^8$, an information of $32 \times 8 \times 8 \times 2^8 = 65,536$ bits can be stored in a square of about 2.6 mm×2.6 mm. In the FIG. 13, plurality of address terminals $A_1, A_2 \ldots, A_m,$ and $B_1, B_2, B_3 \ldots B_m$ are connected to the decorder-1 and the decorder-2, respectively.

In the above description, estimation was made on the basis of an assumption that the minimum pattern has a dimension of 4 μm. However, since it is said that at present a minimum pattern having a dimension of 2 μm can be produced by mass-production even by means of an optical lithography, a higher density integration of four-fold would be possible with such means, and therefore, according to the present invention it becomes possible to store an information of $1.048 \times 10^6$ bits in a square of 5 mm×5 mm.

Embodiment 5

Figure 14:
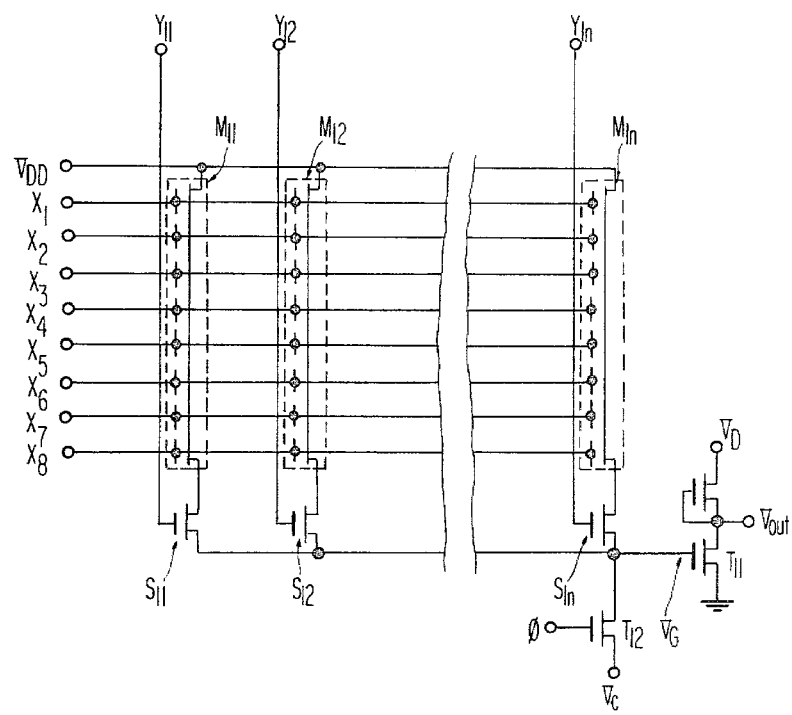
FIG. 14 is a circuit diagram showing a fifth preferred embodiment of the present invention.
Figure 15:
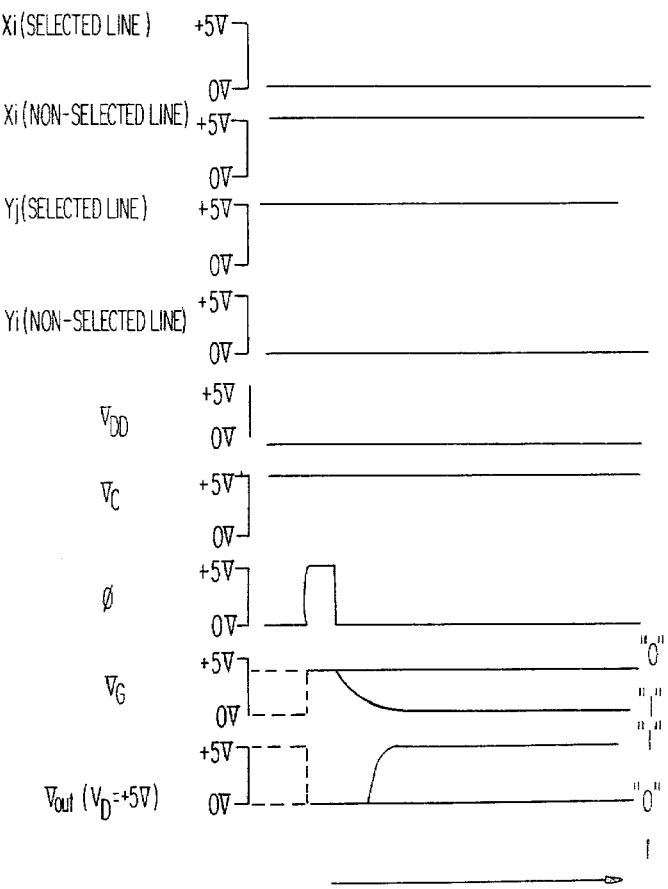
FIG. 15 is a voltage waveform diagram showing voltages applied to various points in the fifth preferred embodiment upon a read-out operation.

A fifth preferred embodiment of the present invention is illustrated in FIG. 14. Similarly to the case of the third preferred embodiment in FIG. 7, a method for applying voltages to various points in the memory device will be explained with reference to FIG. 15 in connection to n-channel elements. However, it is a matter of course that the memory device can be embodied likewise by employing p-channel element. The two threshold values of the memory transistors are selected at $V_{TL} = -3$ V and $V_{TH} = +1.0$ V, the gate threshold voltages of the peripheral transistors $S_{1j}(J=1, 2, \ldots, n)$ and $T_{11}, T_{12}$ are selected at 1.0 V and the values of $V_R = 0$ V and $V_{bias} = 5$ V are selected. In order to select one transistor out of a transistor group, among a gate wire group $Y_{1j}$ of the switching transistors $S_{1j}$ (j being an integer selected from 1, 2, ... n) respectively connected to the sources of the memory transistors, to a selected gate wire is connected a voltage of +5 V, while to unselected gate wires is connected a voltage of 0 V. In addition, selection of one gate in the selected memory transistor can be achieved by applying a voltage of 0 V to a selected one of $X_i$-terminals (in the illustrated embodiment, i being an integer selected from 1 to 8) and a voltage of +5 V to the other unselected $X_i$-terminals. Here, at first let us consider the case where the voltage $V_{DD}$ of the drains of the memory transistors connected in common is held at 0 V the source voltage $V_C$ of the charging/discharging transistor $T_{12}$ is held at +5 V. If a pulse $\phi$ of +5 V in magnitude is applied to the gate of the charging/discharging transistor $T_{12}$, then the gate voltage $V_G$ of the read-out transistor $T_{11}$ is raised up to a voltage near to the source voltage $V_C$, so that the read-out transistor $T_{11}$ becomes conducting and the output voltage $V_{out}$ becomes a nearly zero voltage. After the pulse $\phi$ has been removed and the gate of the charging/discharging transistor $T_{12}$ has become a zero voltage, if the selected gate of the memory transistor has a threshold votlage of $V_{TL} = -3$ V, then a channel exists under the selected gate, so that the charge stored at the gate of the read-out transistor will discharge through that channel section, and eventually the gate voltage $V_G$ of the read-out transistor falls down to the value of $V_{DD}$, that is, a zero voltage. Accordingly, the output voltage $V_{out}$ takes a value substantially equal to $V_{DD}$, because the read-out transistor is turned to a non-conducting state. On the other hand, if the selected gate has a threshold voltage of $V_{TH} = +1$ V, then the charge stored at the gate of the read-out transister is kept intact because no channel exists under the selected gate, and accordingly, the gate voltage $V_G$ and the output voltage $V_{out}$ of the read-out transistor will not vary.

Next, let us consider the case where the voltage $V_{DD}$ is selected at +5 V and the voltage $V_C$ is selected at 0 V. In this case, in response to the pulse $\phi$ applied to the gate of the charging/discharging transistor $T_{12}$, the gate of the read-out transistor is brought to 0 V, and thereafter the gate of the read-out transistor can be charged through the channel formed under the selected gate of the memory transistor. Therefore, if the threshold voltage of the selected gate is equal to $V_{TL} = -3$ V, then the output voltage is 0 V, while if it is equal to $V_{TH} = +1$ V, then a voltage of +5 V is outputted. In other words, in case where the combination of $V_{DD} = +5$ V and $V_C = 0$ V is employed, even when the threshold voltage at the selected gate is the same as that in the case of the combination of $V_{DD} = 0$ V and $V_C = +5$ V, the output voltage is inverted with respect to the latter case.

We claim:

1. A semiconductor memory device comprising; a first semiconductor region of one conductivity type; a plurality of memory transistors formed in said first semiconductor region and arranged in parallel with each other, each of said memory transistor including a pair of source and drain regions of an opposite conductivity type formed in a major surface of said first semiconductor region, a gate insulating layer formed on said major surface between said source and drain regions, a plurality of gate electrodes formed on said gate insulating layer and laterally separated from each other, and a plurality of opposite conductivity type regions formed in said first semiconductor region under the respective intervals between adjacent gate electrodes; an isolation region surrounding said first semiconductor region to prevent parasitic current flow to or from said first semiconductor region through said isolation region; a plurality of gate wiring layers provided to interconnect said gate electrodes of different transistors; and a plurality of switching transistors located outside said isolation region, each said switching transistor being electrically connected at its drain region to said source region of each said memory transistor, respectively.

2. A semiconductor memory device of claim 1, in which source regions of said switching transistors are electrically connected in common to an output of said semiconductor memory device, and drain regions of said memory transistors are respectively connected to current-limiting transistors located outside said isolation region.

3. A semiconductor memory device of claim 1, in which said drain regions of said memory transistors are respectively electrically connected to gates of said switching transistors.

4. A semiconductor memory device of claim 1, in which said plurality of said memory transistors are surrounded with an impurity region of one conductivity type having higher impurity concentration than that of said first semiconductor region.

5. A semiconductor memory device of claim 1, in which said switching transistors are formed in a second semiconductor region of one conductivity type formed on the same substrate of said first semiconductor region.

6. A semiconductor memory device of claim 1, in which said gate insulating layer includes means for storing electric charges.

7. A semiconductor memory device of claim 6, in which said gate insulating layer comprises a silicon oxide film formed on said major surface and a silicon nitride film formed on said slicon oxide film.

8. A semiconductor memory device of claim 1, in which said first semiconductor region is formed on a semiconductor substrate of opposite conductivity type.

9. A semiconductor memory device of claim 1, in which said first semiconductor region is formed on a sapphire substrate.

10. A semiconductor memory device of claim 1, in which said isolation region includes an impurity region of opposite conductivity type.

11. A semiconductor memory device comprising:
a semiconductor region of one conductivity type; a memory transistor formed in said semiconductor region, said memory transistor including a pair of source and drain regions of an opposite conductivity type formed in a major surface of said first semiconductor region, a gate insulating layer formed on said major surface between said source and drain regions and having means for storing electric charge, a plurality of gate electrodes formed on said gate insulating layer and laterally separated from each other, a plurality of opposite conductivity type regions formed in said semiconductor region under the respective intervals between adjacent gate electrodes, and a plurality of channel sections positioned under said gate electrodes; means for applying a first voltage to non-selected gate electrodes so that said channel sections under said non-selected gate electrodes; conduct charge and means for applying a second voltage to a selected gate electrode, said second voltage having such a value that electric charges are injected in a portion of said insulating layer under said selected gate electrode.

12. A semiconductor memory device of claim 11, in which said gate insulating layer comprises a silicon oxide film formed on said major surface and a silicon nitride film formed on said silicon oxide film.

* * * * *

UNITED STATES PATENT AND TRADEMARK OFFICE
CERTIFICATE OF CORRECTION

PATENT NO. : 4,233,526

DATED : November 11, 1980

INVENTOR(S) : KUROGI et al.

It is certified that error appears in the above—identified patent and that said Letters Patent is hereby corrected as shown below:

Column 1, line 31, before "floating" delete "the" and insert -- a -- ;

line 35, before "source" delete "a" and insert -- the -- ;

line 36, before "charge" delete "the" and insert -- a -- .

Column 4, line 68, delete "N-type" and insert -- n-type -- .

Column 7, line 55, delete "the" and insert -- that -- .

Column 9, line 35, delete "Saphire" and insert -- Sapphire -- .

Column 10, line 28, delete "Wirte" and insert -- Write -- .

Column 13, line 3, delete "$32 \times 8 \times 8 \times 2^8$" and insert -- $32 \times 8 \times 2^8$ -- ;

line 6, delete "decorder" (first and second occurrences) and insert -- decoder -- ;

line 46, after "0V" insert -- and -- ;

UNITED STATES PATENT AND TRADEMARK OFFICE
CERTIFICATE OF CORRECTION

PATENT NO. : 4,233,526

DATED : November 11, 1980

INVENTOR(S) : KUROGI et al.

It is certified that error appears in the above—identified patent and that said Letters Patent is hereby corrected as shown below:

Column 13, line 68, delete "transister" and insert -- transistor -- .

Column 16, line 10, after "electrodes" delete ";"

line 11, after "charge" insert -- ; -- .

Signed and Sealed this

Twenty-first Day of April 1981

[SEAL]

Attest:

RENE D. TEGTMEYER

Attesting Officer

Acting Commissioner of Patents and Trademarks